United States Patent
Heikkinen et al.

(10) Patent No.: US 12,249,325 B2
(45) Date of Patent: Mar. 11, 2025

(54) DECIMATOR FOR AUDIO SIGNALS

(71) Applicant: NOKIA TECHNOLOGIES OY, Espoo (FI)

(72) Inventors: Mikko Olavi Heikkinen, Tampere (FI); Miikka Tapani Vilermo, Siuro (FI); Antti Johannes Eronen, Tampere (FI); Arto Juhani Lehtiniemi, Lempäälä (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/326,395

(22) Filed: May 21, 2021

(65) Prior Publication Data
US 2021/0375282 A1    Dec. 2, 2021

(30) Foreign Application Priority Data
May 28, 2020    (GB) ..................... 2008000

(51) Int. Cl.
*G10L 15/22*    (2006.01)
*G10L 21/0208*    (2013.01)
*H04R 5/04*    (2006.01)

(52) U.S. Cl.
CPC .......... *G10L 15/22* (2013.01); *G10L 21/0208* (2013.01); *H04R 5/04* (2013.01)

(58) Field of Classification Search
None
See application file for complete search history.

(56) References Cited

U.S. PATENT DOCUMENTS

| | | |
|---|---|---|
| 7,619,551 B1 | 11/2009 | Wu |
| 9,343,056 B1 | 5/2016 | Goodwin |
| 2007/0021958 A1 | 1/2007 | Visser et al. |
| 2013/0083945 A1 | 4/2013 | Rossum |
| 2013/0121504 A1 | 5/2013 | Adams et al. |
| 2013/0293781 A1 | 11/2013 | Shyshkin et al. |

(Continued)

FOREIGN PATENT DOCUMENTS

| | | |
|---|---|---|
| EP | 1970902 A2 | 9/2008 |
| WO | WO 2018/077713 A2 | 5/2018 |

OTHER PUBLICATIONS

Search Report for United Kingdom Application No. GB2008000.8 dated Nov. 6, 2020, 3 pages.

(Continued)

*Primary Examiner* — Walter F Briney, III
(74) *Attorney, Agent, or Firm* — ALSTON & BIRD LLP

(57) ABSTRACT

Examples of the disclosure relate to an apparatus that provides a decimator for audio signals. The apparatus comprises means for: receiving one or more audio input signals and applying a multi-stage decimation process to the one or more audio input signals wherein the multi-stage decimation process comprises at least a first branch and a second branch. The apparatus also comprises means for applying audio signal analysis to the one or more audio input signals. The audio signal analysis extracts at least one audio signal parameter from the one or more audio input signals and is performed on the output of the first branch of the multi-stage decimation process. Use of the second branch of the multi-stage decimation process is dependent upon the outcome of the audio signal analysis.

20 Claims, 3 Drawing Sheets

(56) References Cited

U.S. PATENT DOCUMENTS

Figure 1:
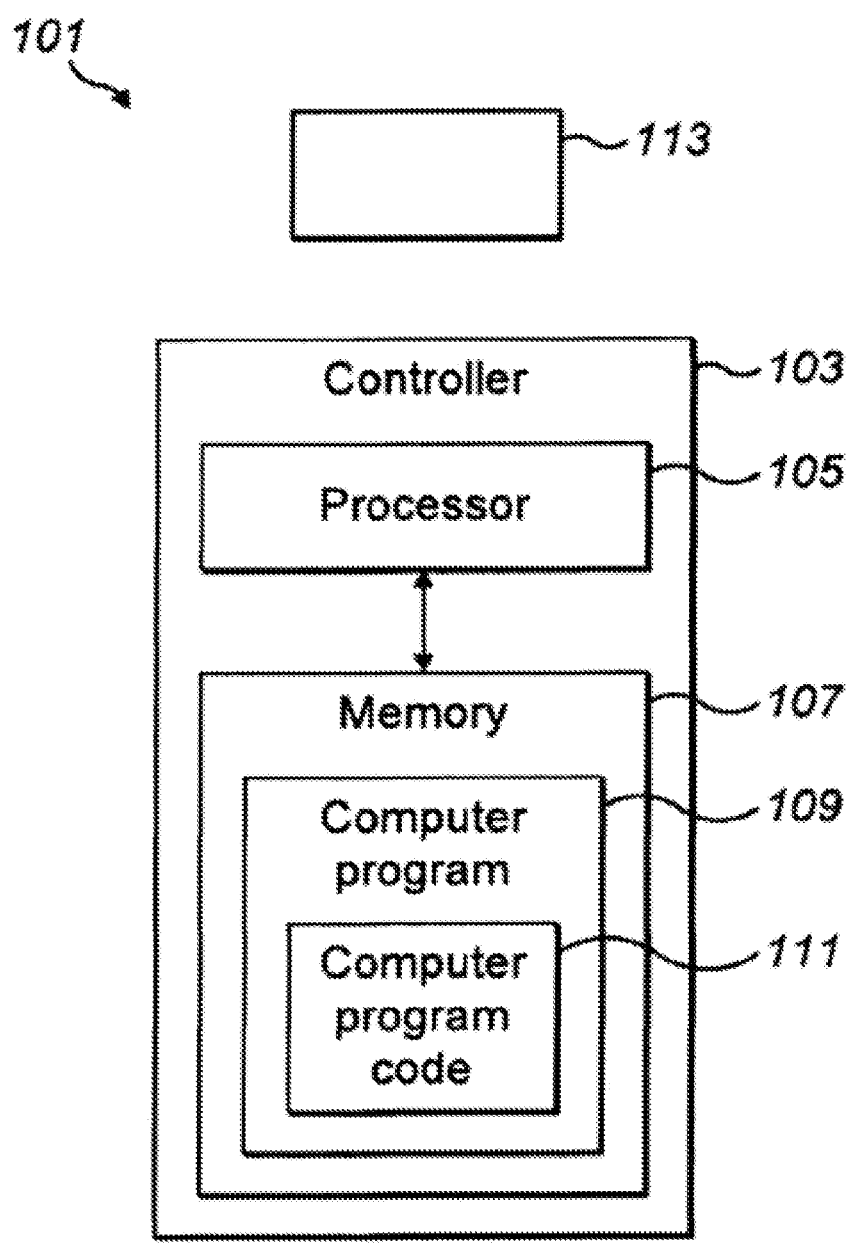

| | | |
|---|---|---|
| 2014/0161271 A1 | 6/2014 | Teranishi |
| 2015/0156587 A1* | 6/2015 | Herbig ................ H04R 3/002 |
| | | 381/71.4 |
| 2016/0240183 A1 | 8/2016 | Noh et al. |
| 2017/0212721 A1* | 7/2017 | Satoskar ................ H03M 1/12 |
| 2019/0132679 A1 | 5/2019 | Poulsen et al. |
| 2020/0105291 A1 | 4/2020 | Sheaffer et al. |
| 2020/0204161 A1* | 6/2020 | Satoskar ................ G06F 17/17 |

OTHER PUBLICATIONS

Zakis et al., "Robust Wind Noise Detection", 2014 IEEE International Conference on Acoustics, Speech and Signal Processing (ICASSP), (May 4-9, 2014), 5 pages.

Extended European Search Report for European Application No. 21173241.7 dated Oct. 18, 2021, 8 pages.

Office Action for European Application No. 21173241.7 dated Jul. 12, 2023, 5 pages.

* cited by examiner

DECIMATOR FOR AUDIO SIGNALS

CROSS-REFERENCE TO RELATED APPLICATIONS

This application claims priority to Great Britain Application No. 2008000.8, filed May 28, 2020, the entire contents of which are incorporated herein by reference.

TECHNOLOGICAL FIELD

Examples of the present disclosure relate to a decimator for audio signals. Some relate to a decimator for audio signals that also allows for noise detection or analysis of other audio signal parameters.

BACKGROUND

Decimation processes that are used for microphone signals can require significant computational resources. This can be particularly problematic for devices that have multiple microphones and a limited power supply, such as mobile devices.

BRIEF SUMMARY

According to various, but not necessarily all, examples of the disclosure there is provided an apparatus comprising means for: receiving one or more audio input signals; applying a multi-stage decimation process to the one or more audio input signals wherein the multi-stage decimation process comprises at least a first branch and a second branch; and applying audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

Audio signal analysis might not be performed on the output of the second branch of the multi-stage decimation process.

The first branch might provide a lower quality level of decimation to the second branch.

The audio signal analysis may comprise at least one of; noise detection, wind noise detection, energy parameters.

If noise is detected for an audio signal the second branch of the multi-stage decimation process is not completed for that audio signal.

If noise is not detected for an audio signal the second branch of the multi-stage decimation process is completed for that audio signal.

The multi-stage decimation process may comprise a common portion and the output of the common portion is provided to both the first branch and the second branch.

The decimated audio signals may be provided to an audio processor and wherein the audio processor also receives information indicating which audio input signals have not been provided to the second branch of the decimator.

The one or more audio input signals may be received from one or more digital microphones.

According to various, but not necessarily all, examples of the disclosure there may be provided, an apparatus comprising: at least one processor; and at least one memory including computer program code; the at least one memory and the computer program code configured to, with the at least one processor, cause the apparatus at least to perform: receiving one or more audio input signals; applying a multi-stage decimation process to the one or more audio input signals wherein the multi-stage decimation process comprises at least a first branch and a second branch; and applying audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

According to various, but not necessarily all, examples of the disclosure there may be provided a method comprising: receiving one or more audio input signals; applying a multi-stage decimation process to the one or more audio input signals wherein the multi-stage decimation process comprises at least a first branch and a second branch; and applying audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

In the method audio signal analysis might not be performed on the output of the second branch of the multi-stage decimation process.

In the method the first branch provides a lower quality level of decimation to the second branch.

In the method the audio signal analysis may comprise at least one of; noise detection, wind noise detection, energy parameters.

In the method if noise is detected in an audio signal the second branch of the multi-stage decimation process is not completed for that audio signal.

In the method if noise is not detected in an audio signal the second branch of the multi-stage decimation process is completed for that audio signal.

In the method the multi-stage decimation process comprises a common portion and the output of the common portion is provided to both the first branch and the second branch.

In the method the decimated audio signals are provided to an audio processor and wherein the audio processor also receives information indicating which audio input signals have not been provided to the second branch of the decimator.

In the method the one or more audio input signals are received from a plurality of digital microphones.

According to various, but not necessarily all, examples of the disclosure there may be provided a computer program comprising computer program instructions that, when executed by processing circuitry, cause: receiving one or more audio input signals; applying a multi-stage decimation process to the one or more audio input signals wherein the multi-stage decimation process comprises at least a first branch and a second branch; and applying audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

In the computer program the audio signal analysis is not performed on the output of the second branch of the multi-stage decimation process.

BRIEF DESCRIPTION

Figure 2:
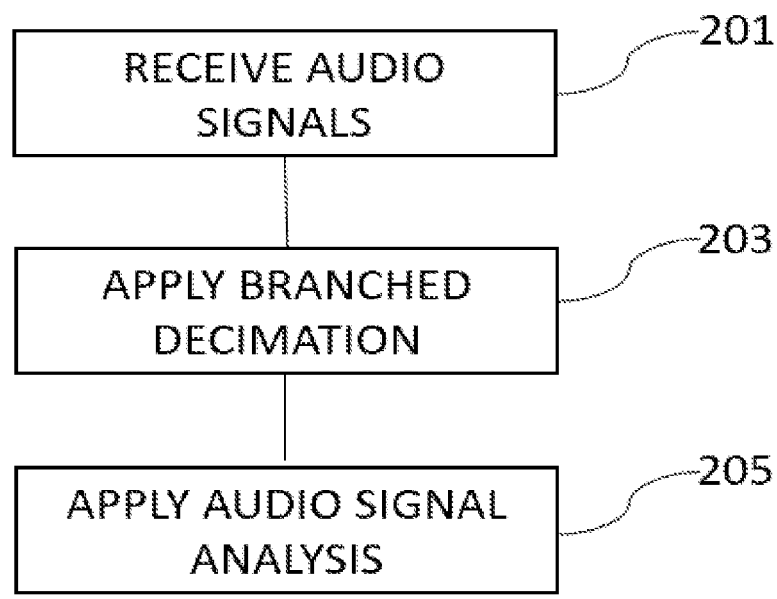
Figure 3:
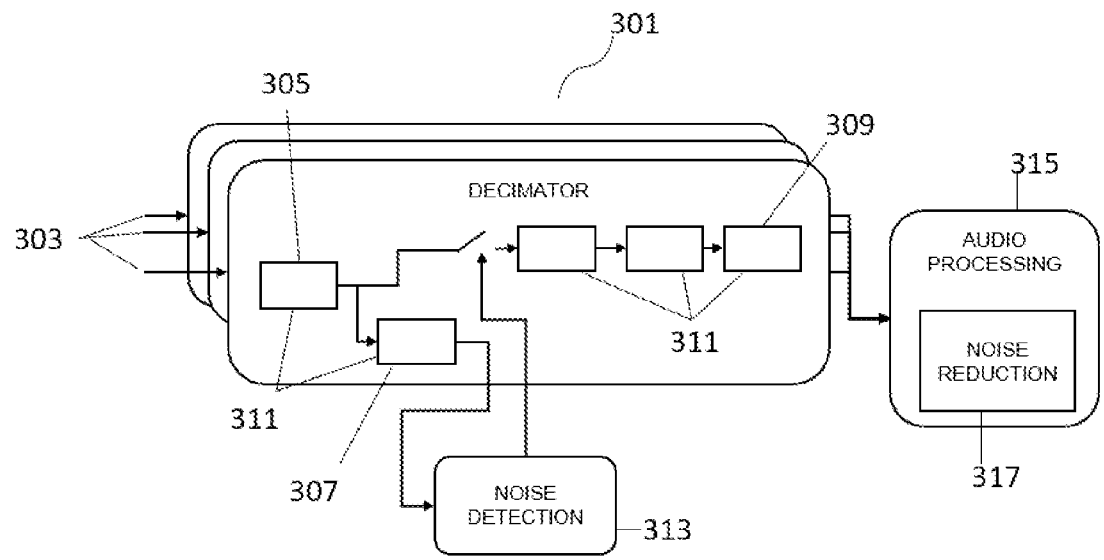
Figure 4:
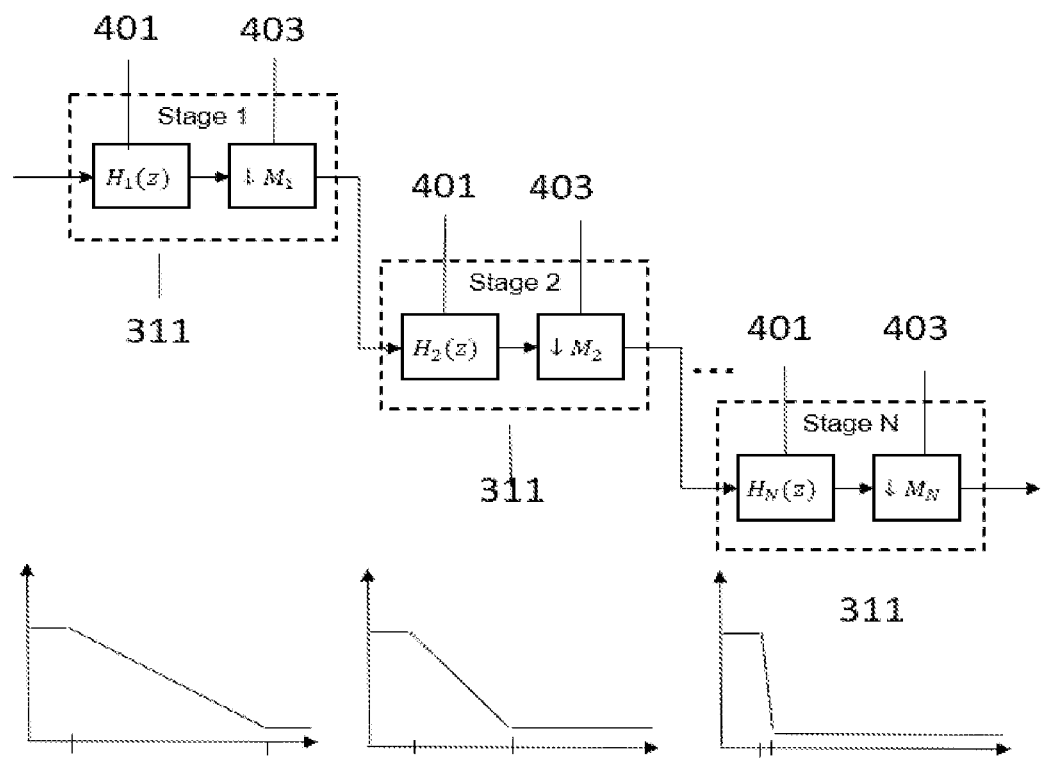

Some examples will now be described with reference to the accompanying drawings in which:

FIG. 1 shows an example apparatus;
FIG. 2 shows an example method;
FIG. 3 shows an example decimator; and
FIG. 4 shows example stages of a decimator.

DETAILED DESCRIPTION

Apparatus 101 according to examples of the disclosure improve the efficiency of processing audio signals captured by audio microphones. In particular the apparatus 101 can provide this improved efficiency by providing a branched decimation process so that noise detection can be performed on partially decimated signals.

The figures illustrate an apparatus 101 comprising means for receiving 201 one or more audio input signals; applying 203 a multi-stage decimation process to the one or more audio input signals wherein the multi-stage decimation process comprises at least a first branch and a second branch; and applying 205 audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

FIG. 1 schematically illustrates an apparatus 101 according to examples of the disclosure. The apparatus 101 illustrated in FIG. 1 may be a chip or a chip-set. In some examples the apparatus 101 may be provided within devices such as a processing device. In some examples the apparatus 101 may be provided within an audio capture device or an audio rendering device.

In the example of FIG. 1 the apparatus 101 comprises a controller 103. In the example of FIG. 1 the implementation of the controller 103 may be as controller circuitry. In some examples the controller 103 may be implemented in hardware alone, have certain aspects in software including firmware alone or can be a combination of hardware and software (including firmware).

As illustrated in FIG. 1 the controller 103 may be implemented using instructions that enable hardware functionality, for example, by using executable instructions of a computer program 109 in a general-purpose or special-purpose processor 105 that may be stored on a computer readable storage medium (disk, memory etc) to be executed by such a processor 105.

The processor 105 is configured to read from and write to the memory 107. The processor 105 may also comprise an output interface via which data and/or commands are output by the processor 105 and an input interface via which data and/or commands are input to the processor 105.

The memory 107 is configured to store a computer program 109 comprising computer program instructions (computer program code 111) that controls the operation of the apparatus 101 when loaded into the processor 105. The computer program instructions, of the computer program 109, provide the logic and routines that enables the apparatus 101 to perform the methods illustrated in FIG. 2. The processor 105 by reading the memory 107 is able to load and execute the computer program 109.

The apparatus 101 therefore comprises: at least one processor 105; and at least one memory 107 including computer program code 111, the at least one memory 107 and the computer program code 111 configured to, with the at least one processor 105, cause the apparatus 101 at least to perform: receiving 201 one or more audio input signals; applying 203 a multi-stage decimation process to the one or more audio input signals wherein the multi-stage decimation process comprises at least a first branch and a second branch; and applying 205 audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

As illustrated in FIG. 1 the computer program 109 may arrive at the apparatus 101 via any suitable delivery mechanism 113. The delivery mechanism 113 may be, for example, a machine readable medium, a computer-readable medium, a non-transitory computer-readable storage medium, a computer program product, a memory device, a record medium such as a Compact Disc Read-Only Memory (CD-ROM) or a Digital Versatile Disc (DVD) or a solid state memory, an article of manufacture that comprises or tangibly embodies the computer program 109. The delivery mechanism may be a signal configured to reliably transfer the computer program 109. The apparatus 101 may propagate or transmit the computer program 109 as a computer data signal. In some examples the computer program 109 may be transmitted to the apparatus 101 using a wireless protocol such as Bluetooth, Bluetooth Low Energy, Bluetooth Smart, 6LoWPan (IP$_v$6 over low power personal area networks) ZigBee, ANT+, near field communication (NFC), Radio frequency identification, wireless local area network (wireless LAN) or any other suitable protocol.

The computer program 109 comprises computer program instructions for causing an apparatus 101 to perform at least the following: receiving 201 one or more audio input signals; applying 203a multi-stage decimation process to the one or more audio input signals wherein the multi-stage decimation process comprises at least a first branch and a second branch; and applying 205 audio signal analysis to the one or more audio input signals wherein the audio signal analysis extracts at least one audio signal parameter from the one or more audio input signals and is performed on the output of the first branch of the multi-stage decimation process and use of the second branch of the multi-stage decimation process is dependent upon the outcome of the audio signal analysis.

The computer program instructions may be comprised in a computer program 109, a non-transitory computer readable medium, a computer program product, a machine readable medium. In some but not necessarily all examples, the computer program instructions may be distributed over more than one computer program 109.

Although the memory 107 is illustrated as a single component/circuitry it may be implemented as one or more separate components/circuitry some or all of which may be integrated/removable and/or may provide permanent/semi-permanent/dynamic/cached storage.

Although the processor 105 is illustrated as a single component/circuitry it may be implemented as one or more separate components/circuitry some or all of which may be integrated/removable. The processor 105 may be a single core or multi-core processor.

References to "computer-readable storage medium", "computer program product", "tangibly embodied computer program" etc. or a "controller", "computer", "processor" etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term "circuitry" may refer to one or more or all of the following:

(a) hardware-only circuitry implementations (such as implementations in only analog and/or digital circuitry) and (b) combinations of hardware circuits and software, such as (as applicable):

(i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions and (c) hardware circuit(s) and or processor(s), such as a microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

The blocks illustrated in the FIGS. 2 to 4 can represent steps in a method and/or sections of code in the computer program 109. The illustration of a particular order to the blocks does not necessarily imply that there is a required or preferred order for the blocks and the order and arrangement of the block may be varied. Furthermore, it can be possible for some blocks to be omitted.

FIG. 2 shows an example method that can be implemented by an apparatus 101 as shown in FIG. 1.

The method comprises, at block 201, receiving one or more audio input signals. The audio input signals can be received from one or more microphones. The microphones can comprise digital microphones or any other suitable types of microphones. In some examples a plurality of audio input signals can be received from a plurality of spatially distributed microphones that can enable a spatial audio signal to be captured, or that can enable noise such as wind noise to be detected.

The apparatus 101 that performs the method could be provided within an audio capturing device comprising one or more microphones. In such examples the audio capturing device could perform both the capturing of the audio signals and the processing of the audio signals. In other examples the apparatus 101 that performs the method could be separate to the audio capturing device. In such examples the audio signals can be captured by one or more microphones and then transmitted to one or more other devices for processing.

At block 203 the method comprises applying a multi-stage decimation process to the one or more audio input signals. Where a plurality of audio input signals are received the multi-stage decimation process can be applied to each of the plurality of audio input signals.

The multi-stage decimation process comprises at least a first branch and a second branch. The multi-stage decimation process can also comprise a common portion. The common portion can provide an output to both the first branch and the second branch so that the two branches share one or more initial stages of the decimation process.

The first branch of the decimation process provides a lower quality level of decimation compared to the second branch. The first branch can comprise fewer decimation stages than the second branch. The first branch can require fewer processing resources than the second branch. In some examples, the first branch can provide a partial decimation process whereas the second branch can provide a full decimation process.

At block 205 the method comprises applying 205 audio signal analysis to the one or more audio input signals. The audio signal analysis is performed on the output of the first branch of the multi-stage decimation process so that the audio signal analysis can be performed on a partially decimated, or low quality decimated, audio signal.

The audio signal analysis can comprise any analysis that enables at least one audio signal parameter to be extracted from the one or more audio input signals. The at least one audio signal parameter can comprise an indication of a signal quality. In some examples the signal parameter can comprise noise levels, energy levels or any other suitable parameters.

In some examples the audio signal analysis can comprise a noise detection process that can detect whether or not noise is present in an audio signal. The noise can comprise unwanted sounds in the respective audio signals. The noise can comprise noise that does not correspond to a sound field captured by the microphones. For example, the noise could be wind noise, handling noise or any other suitable type of noise.

Any suitable process can be used to detect whether or not noise is present in the audio signals. For example, the noise level could be determined by monitoring signal level differences between frequency bands, monitoring correlations between the different audio signals or any other suitable method.

The noise detection process can detect whether or not the noise level is above or below a threshold level. The threshold level can be zero or some other value. For example, the threshold level could be a level at which the noise present would not be perceptible to a user. The threshold level that determines an acceptable level of noise may be dependent upon the application for which the audio signals are intended to be used for. In some examples the threshold levels may be variable relative to signal energy.

In some examples the audio signal analysis could be configured to detect the loudest signal from a plurality of audio input signals by comparing the energy levels of the different signals. In some examples the loudest signal can be considered to be obtained from the microphone closest to the sound source. This signal could then be used for speech recognition or other suitable processes and the other quieter signals could be disregarded.

The multi-stage decimation process is configured so that the use of the second branch is dependent upon the outcome of the audio signal analysis that is applied to the output of the first branch. If the extracted parameter meets one or more criteria then the second branch of the decimation process is used but if the extracted parameters does not meet the one or more criteria then the second branch of the decimation process is not used.

In examples where the audio signal analysis comprises noise detection if noise is detected for an audio signal the second branch of the multi-stage decimation process is not completed for that audio signal. Conversely if noise is not detected for an audio signal then the second branch of the multi-stage decimation process is completed for that audio signal.

As the audio signal analysis is performed on the low quality decimated signal provided by the first branch the second branch of the decimation process, providing the full level of decimation, is only used if one or more criteria of the parameters of the audio signal are satisfied. The parameters can relate to the quality of the audio signals, for example the noise levels within the audio signals.

The audio signal analysis is not performed on the output of the second branch of the multi-stage decimation process. This means that the audio signal analysis is performed on low quality decimated signals rather than high quality decimated signals. This means that the audio signal analysis can be performed before the full decimation process has been completed and only signals with acceptable parameters are fully decimated. This reduces the processing resources that are required.

The high quality decimated audio signals provided as an output of the second branch of the decimation process can be provided to an audio processor. The audio processor can be configured to perform any suitable processing on the decimated audio signals. For instance, the audio processor could apply spatial processing to enable spatial audio signals to be rendered or any other suitable type of processing.

The apparatus 101 can be configured to provide information to the audio processor indicating which audio input signals comprise noise. This can enable the audio processor to select the audio input signals which do not have any noise or which comprise an acceptable level of noise. This can enable the audio processor to provide an output signal with a low level of noise.

FIG. 3 schematically shows an example branched decimator 301 that can be used in examples of the disclosure. The decimator 301 can be implemented by an apparatus 101 such as the apparatus shown in FIG. 1. The decimator 301 comprises a plurality of stages 311 that are divided into a first branch 307, a second branch 309 and a common portion 305. Each of the stages 311 can comprise an anti-aliasing filter and a decimator which can be as shown in FIG. 4 and described below. The anti-aliasing filter and the decimators can be different for the different stages 311.

A plurality of audio input signals 303 are provided to the branched decimator 301. The audio input signals can be received from a plurality of digital microphones or from any other suitable source of audio signals. The audio input signals 303 are provided as an input to the common portion 305.

In the example of FIG. 3 the common portion 305 comprises one stage 311. It is to be appreciated that in other examples the common portion 305 can comprise a different number of stages.

The output signal of the common portion 305 can be provided to both the first branch 307 and the second branch 309 so that the common portion 305 of the decimator 301 is shared by both the first branch 307 and the second branch 309.

The common portion 305 of the decimator 301 can be designed so as to provide an output that is suitable for an input for both the first branch 307 and the second branch 309. The common portion 305 can be designed to provide an output that is suitable as an input for both the first branch 307 and the second branch 309 by controlling the parameters of the anti-aliasing filters and decimation factors used within the stages 311 of the common portion 305. For example, the anti-aliasing filters used in the common portion 305 can be designed to provide a steep roll off slope so that the aliasing error is acceptable for noise detection. In some examples the filters used in the common portion 305 of the decimator 301 can comprise infinite impulse response (IIR) filters or any other suitable type of filters that ensure that the passband of the output of the decimator 301 has a linear phase.

In the example shown in FIG. 3 all of the input signals are processed by the common portion 305. The output of the common portion 305 is provided to both the first branch 307 and the second branch 309 of the decimator 301.

All of the input signals 303 are processed by the first branch 307. The first branch 307 provides a low-quality decimation process that provides an output signal that can be used for noise detection. The first branch 307 can provide an output with a lower sampling rate and/or a lower bit depth than the second branch 309. For example, the first branch 307 can provide an output with a bit depth of 8 and a sampling rate of 8 kHz.

As the output of the first branch 307 is only used for noise detection it is possible to tolerate aliasing error within the output provided that the aliasing noise energy if considerably lower than the actual signal that would result from a higher quality decimation process such as the process provided by the second branch 309 of the decimator.

The first branch 307 of the decimator 303 therefore enables an output to be provided for noise detection with low computational cost.

The output of the first branch 307 is provided to a noise detection module 313 so that noise detection can be performed on the output of the first branch 307 of the decimator 301. The noise detection process can comprise any suitable type of process to detect any suitable type of noise. In some examples the nose detection process can comprise wind noise detection. The wind noise can be detected by comparing inter-channel level differences. The wind noise detection can therefore use two or more of the plurality of input signals.

In some examples where the noise detection compares the inter-channel differences the audio signals with the least energy at low frequencies could be selected as the signals with the least noise. In a more complex process a correlation between two or more audio signals can be calculated. If the correlation is below a threshold this can be an indication that noise, such as wind noise, is present in the audio signals. In this case the audio input signal with the least energy would be selected as the signal with the least noise. If the correlation is above a threshold this can be an indication that there is no, or very little, noise present. In this case the audio signal with the highest energy levels can be chosen as this is obtained from the microphone closest to the sound source.

The noise detection process can detect whether or not the noise level is above a certain threshold. The threshold could be zero or could be another level, for example, a level that is not perceptible to an end user.

Whether or not the second branch 309 of the decimator 301 is used will depend on the outcome of the noise detection. Information relating to the outcome of the noise detection process can be provided to the second branch 309 of the decimator 301 so that if the noise detection process detects that noise is present in an audio signal 303 then the second branch 309 of the decimator 301 is not used but if noise is not present in the audio signal then the second branch 309 of the decimator 301 can be used.

Noise can be considered to be present in the audio signal 303 if the noise is above a threshold that can be zero or another level.

The second branch 309 of the decimator 301 can provide a high-quality decimation process. The second branch 309 of the decimator 301 can comprise more stages 311 than the first branch 307 of the decimator 301. The second branch 309 of the decimator 301 can be configured to provide a high-quality output signal.

The second branch 309 comprises a different portion of the decimator 301 to the first branch 307. The stages 311 that are used within the first branch 307 are not used within the second branch 309. Similarly, the stages 311 that are used within the second branch 309 are not used within the first branch 307.

The output of the second branch 309 of the decimator 301 is provided to an audio processing module 315. The audio processing module 315 is configured to process the decimated signals to as needed. For example, if the apparatus 101 is configured for providing spatial audio the audio processing module 315 can process the decimated audio signals from the second branch 309 to enable spatial audio to be rendered fora user. In such examples the audio processing module 315 can comprise a noise reduction module 317 that can be configured to reduce the noise in the output signals that are provided to a user. The noise reduction module 317 can use information obtained from the noise detection module 313 to enable the noise reduction.

The apparatus 101 can be configured so that the audio processing module 315 receives information indicating which of the plurality of input signals 303 comprise noise. The audio processing module 315 can then disregard audio signals comprising noise. For example, the audio processing module 315 can perform the spatial processing using only the audio signals with a low noise level.

In some examples the audio processing module 315 could perform different types of audio processing such as speech recognition. For example, the audio processing module 315 could be configured to analyse signals to recognize input commands. In such examples the audio processing module 315 can receive information indicating which of the input signals do not comprise noise and then the audio processing module 315 can select one or more of these signals with a low noise level for speech recognition processing.

FIG. 4 schematically shows example stages 311 that can be provided within a multi-stage decimator 301 such as the decimator 301 shown in FIG. 3. The stages 311 shown in FIG. 4 can be used for converting a pulse density modulation (PDM) output signal to a Pulse code modulation (PCM) output signal. The stages 311 shown in FIG. 4 could be used in the respective first or second branches 307, 309 or in the common portion 305 of decimators 301 such as the branched decimator 301 shown in FIG. 3.

FIG. 4 shows a plurality of example stages 311 where each stage 311 comprises an anti-aliasing low-pass filter 401 followed by a decimation module 403. The output of a first stage 311 is provided as an input to the next stage 311. In the example shown in FIG. 4 N stages 311 are shown however, it is to be appreciated that any number of stages 311 can be used in examples of the disclosure. The use of the plurality of stages 311 within a decimator 301 means that the word length can be increased gradually between the stages instead of being increased directly to the target word length and so reduces the computational cost. Different numbers of stages 311 can be provided in the different branches 307, 309 of the decimator 301.

Each decimation module 403 has a decimation factor M so that for each stage 311 the sampling rate of the signal is reduced by the decimation factor M of the decimation module 403 within the stage 311. The decimation factor M can be different for the different stages 311 within the decimator 301.

The anti-aliasing filters 401 can be designed with a gentle roll-off slope. This results in shorter filters 401 and enables an efficient process to be provided.

In the example plurality of stages 311 shown in FIG. 4 the input is 1-bit PDM signal with sampling rate of $F_{in}$. The first stage 311 comprises an anti-aliasing low-pass filter 401 and a decimation module 403 so that the output sampling rate is $F_{in}/M_1$ where $M_1$ is the decimation factor of the decimation module 403 in the first stage 311.

The anti-aliasing filters 401 can be designed so that the cut-off point is set to the desired output sampling rate $F_{out}$. The transition band of the filters 401 can be designed so that the stopband starts at $F_{in}/M_1$, to prevent aliasing from the decimation. For the first stage 311 shown in FIG. 4 the transition band is very wide, which makes the filter 401 computationally light.

The output of the first stage 311 is provided as the input for the second stage 311. The second stage 311 also comprises a filter 401 and a decimation module 403 so that the output sampling rate for the second stage is $F_{in}/M_1*M_2$ where $M_1$ is the decimation factor of the decimation in the first stage 311 and $M_2$ is the decimation factor in the second stage 311. The filter 401 can be designed so that the cut-off is set to $F_{out}$ and the stop band starts at $F_{in}/M_1*M_2$. The filter slope for the second stage 311 is steeper compared to the filter slope for the first stage 311. However, the signal has already been low-pass filtered in the first stage 311 so the combined output of the first filter $H_1(Z)$ and the second filter $H_2(Z)$ need to satisfy anti-aliasing criteria. This allows for a computationally lighter filter for $H_2(Z)$.

The processes of filtering followed by decimation is repeated for each of the plurality of stages 311 of the decimator 301 so that the output sampling rate $F_{out}$ is the input sampling rate divided by the product of all decimation stages $F_{in}/M_1*M_2* \ldots *M_N$. The spectrum of the signal before each decimation is affected by all the anti-aliasing filters 401 in the previous stages.

The bit depth in the output of a stage 311 can be the same or greater than the bit depth in the input of the stage 403. Where the input signal comprises PDM the input bit depth is 1. The bit depth for the output signal can be any suitable number. For example, the bit depth could be 16 or 24 for a high-quality audio output.

Examples of the disclosure therefore provide an improved decimation process for audio processing. In this improved process the noise detection process can be performed before the decimation process is completed. This reduces the computational resources that are required. This can be beneficial in many applications such as spatial audio capturing and voice recognition. This can also help to reduce power consumption in devices. For example, devices that can be activated via voice command need to have microphones that are always operation to detect the input commands. These improved decimation processes can help to reduce the computational and power requirements in such devices.

The above described examples find application as enabling components of: automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims. For instance, in the above examples a plurality of audio input signals are received however in other examples a single audio input signal could be received. For instance, a single audio input signal could be received from a single microphone for the purpose of speech recognition or other analysis. However, if the noise levels in the single audio input signal are too high then the speech recognition of other analysis would not be successful. Therefore, the branched decimator as described above could be used for a single audio input signals and could prevent signals with high noise level from being decimated and used and so could help to save processing power.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising: at least one processor; and at least one memory including computer program code; the at least one memory and the computer program code configured to, with the at least one processor, cause the apparatus at least to:
   receive two or more audio input signals that are provided to a first branch;
   initiate a multi-stage decimation process to the two or more audio input signals, wherein (i) the multi-stage decimation process is configured to decimate the two or more audio input signals using a second branch based on an audio signal analysis applied on an output of the first branch, (ii) the output of the first branch is of a lower quality than an output of the second branch, (iii) the output of the first branch is used for noise detection, and (iv) the first branch comprises fewer decimation stages than the second branch;
   apply the audio signal analysis to the output of the first branch, wherein the audio signal analysis is configured to determine at least one audio signal parameter for one or more of the two or more audio input signals, using the output of the first branch, and wherein the second branch of the multi-stage decimation process is used in a manner dependent upon the noise detection for two or more of the two or more audio input signals for which the at least one audio signal parameter is not determined; and
   provide the output of the second branch for which the at least one audio signal parameter is not determined to an audio processor.

2. An apparatus as claimed in claim 1, wherein the first branch provides a lower quality level of decimation to the second branch.

3. An apparatus as claimed in claim 1, wherein the audio signal analysis comprises at least one of: noise detection; wind noise detection; and energy parameters.

4. An apparatus as claimed in claim 3, wherein if noise is detected for an audio signal the second branch of the multi-stage decimation process is not completed for that audio signal.

5. An apparatus as claimed in claim 3, wherein if noise is not detected for an audio signal the second branch of the multi-stage decimation process is completed for that audio signal.

6. An apparatus as claimed in claim 1, wherein the multi-stage decimation process comprises a common portion and an output of the common portion is provided to both the first branch and the second branch.

7. An apparatus as claimed in claim 1, wherein the decimated two or more audio signals are provided to the audio processor and wherein the audio processor receives information indicating which audio input signals have not been provided to the second branch.

8. An apparatus as claimed in claim 1, wherein the two or more audio input signals are received from one or more digital microphones.

9. An apparatus as claimed in claim 1, wherein the noise detection is based on whether a noise level satisfies a threshold level at which noise is perceptible to a user.

10. An apparatus as claimed in claim 1, wherein the audio signal analysis further comprises:
    detecting that an audio signal of the two or more audio input signals is the loudest signal by comparing a respective energy level of the two or more audio input signals; and
    other than the audio signal that was detected to be the loudest signal, discarding the two or more audio input signals that were not detected to be the loudest signal.

11. A method comprising:
    receiving two or more audio input signals that are provided to a first branch;
    initiating a multi-stage decimation process to the two or more audio input signals, wherein (i) the multi-stage decimation process is configured to decimate the two or more audio input signals using a second branch based on an audio signal analysis applied on an output of the first branch, (ii) the output of the first branch is of a lower quality than an output of the second branch, (iii) the output of the first branch is used for noise detection, and (iv) the first branch requires fewer processing resources than the second branch;
    applying the audio signal analysis to the output of the first branch, wherein the audio signal analysis is configured to determine at least one audio signal parameter for one or more of the two or more audio input signals, using the output of the first branch, and wherein the second branch of the multi-stage decimation process is used in a manner dependent upon the noise detection for two or more of the two or more audio input signals for which the at least one audio signal parameter is not determined; and
    providing the output of the second branch for which the at least one audio signal parameter is not determined to an audio processor.

12. A method as claimed in claim 11, wherein audio signal analysis is not performed on the output of the second branch of the multi-stage decimation process.

13. A method as claimed in claim 11, wherein the audio signal analysis comprises at least one of: noise detection; wind noise detection; and energy parameters.

14. A method as claimed in claim 13, wherein if noise is detected in an audio signal the second branch of the multi-stage decimation process is not completed for that audio signal.

15. A method as claimed in claim 13, wherein if noise is not detected in an audio signal the second branch of the multi-stage decimation process is completed for that audio signal.

16. A method as claimed in claim 11, wherein the multi-stage decimation process comprises a common portion and an output of the common portion is provided to both the first branch and the second branch.

17. A method as claimed in claim 11, wherein the decimated two or more audio signals are provided to the audio processor and wherein the audio processor receives information indicating which audio input signals have not been provided to the second branch.

18. A method as claimed in claim 11, wherein the two or more audio input signals are received from a plurality of digital microphones.

19. A non-transitory computer readable medium comprising computer program instructions that, when executed by processing circuitry, cause:
    receiving two or more audio input signals that are provided to a first branch;
    initiating a multi-stage decimation process to the two or more audio input signals, wherein (i) the multi-stage decimation process is configured to decimate the two or more audio input signals using a second branch based on an audio signal analysis applied on an output of the first branch, (ii) the output of the first branch is of a lower quality than an output of the second branch, (iii) the output of the first branch is used for noise detection, and (iv) the first branch comprises fewer decimation stages than the second branch;
    applying the audio signal analysis to the output of the first branch, wherein the audio signal analysis is configured to determine at least one audio signal parameter for one or more of the two or more audio input signals, using the output of the first branch, and wherein the second branch of the multi-stage decimation process is used in a manner dependent upon the noise detection for two or more of the two or more audio input signals for which the at least one audio signal parameter is not determined; and
    providing the output of the second branch for which the at least one audio signal parameter is not determined to an audio processor.

20. A non-transitory computer readable medium as claimed in claim 19, wherein audio signal analysis is not performed on the output of the second branch of the multi-stage decimation process.

* * * * *